(12) United States Patent
Narayanan et al.

(10) Patent No.: US 6,964,929 B1
(45) Date of Patent: Nov. 15, 2005

(54) METHOD OF FORMING A NARROW GATE, AND PRODUCT PRODUCED THEREBY

(75) Inventors: Sundar Narayanan, Santa Clara, CA (US); Chidambaram Kallingal, San Jose, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 10/137,244

(22) Filed: May 2, 2002

(51) Int. Cl.[7] .................................... H01L 21/302
(52) U.S. Cl. ................ 438/745; 438/755; 438/756; 438/757
(58) Field of Search ................. 438/745, 749, 438/750, 754–7, 751, 755–757

(56) References Cited

U.S. PATENT DOCUMENTS

| | | | |
|---|---|---|---|
| 5,545,588 A | 8/1996 | Yoo | 437/187 |
| 5,604,157 A | 2/1997 | Dai | 437/200 |
| 5,670,423 A | 9/1997 | Yoo | 437/192 |
| 6,010,955 A | 1/2000 | Hashimoto | 438/597 |
| 6,030,541 A | 2/2000 | Adkisson et al. | 216/51 |
| 6,136,679 A | 10/2000 | Yu et al. | 438/592 |
| 6,159,860 A | 12/2000 | Yang | 438/706 |
| 6,171,763 B1 | 1/2001 | Wang et al. | 430/318 |
| 6,177,351 B1 | 1/2001 | Beratan et al. | 438/694 |
| 6,200,907 B1 | 3/2001 | Wang et al. | 438/718 |
| 6,245,682 B1 | 6/2001 | Fu et al. | 438/696 |
| 6,261,967 B1 | 7/2001 | Athavale et al. | 438/717 |
| 6,287,975 B1 | 9/2001 | DeOrnellas et al. | 438/710 |
| 6,291,356 B1 | 9/2001 | Ionov et al. | 438/710 |
| 6,294,459 B1 | 9/2001 | Yin et al. | 438/636 |
| 6,319,821 B1 | 11/2001 | Liu et al. | 438/636 |
| 6,368,982 B1 * | 4/2002 | Yu | 438/753 |
| 6,420,097 B1 * | 7/2002 | Pike et al. | 430/313 |
| 6,828,205 B2 * | 12/2004 | Tsai et al. | 438/313 |
| 2003/0022517 A1 * | 1/2003 | Andideh et al. | 438/745 |
| 2003/0148619 A1 * | 8/2003 | Tsai et al. | 438/704 |

OTHER PUBLICATIONS

Ghandi, S.K., VLSI Fabrication Principles: Silicon and Gallium Arsenide, 1994. John Wiley & Sons, 2nd edition, pp. 608-610,649.*

IBM Technical Bulletin entitled "Gate Structure—Fabrication", pp. 4064-4065, Feb. 1987.

* cited by examiner

*Primary Examiner*—Hoai Pham
*Assistant Examiner*—Ginette Peralta
(74) *Attorney, Agent, or Firm*—Evan Law Group LLC

(57) ABSTRACT

A method of making a semiconductor structure includes trimming a patterned hard mask with a wet etch, wherein the hard mask is on a gate layer; and etching the gate layer. In making multiple structures on a semiconductor wafer, an average width of lines in the patterned hard mask is trimmed by at least 100 Å.

18 Claims, 4 Drawing Sheets

METHOD OF FORMING A NARROW GATE, AND PRODUCT PRODUCED THEREBY

BACKGROUND

Modern integrated circuits are constructed with up to several million active devices, such as transistors and capacitors, formed in and on a semiconductor substrate. Interconnections between the active devices are created by providing a plurality of conductive interconnection layers, such as polycrystalline silicon and metal, which are etched to form conductors for carrying signals. The conductive layers and interlayer dielectrics are deposited on the silicon substrate wafer in succession, with each layer being, for example, on the order of 1 micron in thickness.

A common intermediate structure for constructing integrated circuits is the stack structure. FIG. 1 illustrates the stack structure and the typical process for forming it. The process begins with structure 10, which has a silicon substrate 12 supporting one or more layers of gate materials, shown collectively as 14. The gate materials may include a variety of layers including oxides, polycrystalline silicon (polysilicon) or polycrystalline silicon-germanium, metals such as tungsten, and nitrides such as titanium nitride. Above the gate layer is a hard mask layer 16, which may also include a variety of layers including nitrides, anti-reflective coatings (ARC), oxides, and silicides. Finally, a resist material 18 is present on top of the structure. Here the resist layer has been patterned, for example by standard lithographic techniques.

Referring still to FIG. 1, etching of the hard mask layer 16 in the regions not covered by the resist material 18 allows for the formation a patterned hard mask 22 as illustrated in structure 20. The resist may then be stripped to yield structure 30, which has patterned hard mask 22 as the only masking layer. The patterned hard mask protects the underlying gate materials during the processing of the exposed portions of the gate materials. This processing may include steps such as etching, to yield structure 40 with a patterned gate layer 42. The processing may also include depositing, oxidation and ion implantation to form functional elements within the structure, such as gates, source/drain regions, contacts, isolation areas and vias.

There is an ongoing need to reduce the size of the elements within integrated circuits and semiconductor structures. The smallest width of any element in a semiconductor device is typically referred to as the critical dimension (CD) of the device. Two conventional methods for reducing the CD, and therefore reducing the width of the gate structures, are resolution enhancement and dry etching. Resolution enhancement can reduce the CD of the resist pattern, thus providing for a smaller CD in the subsequent etch processes. Although this method can provide very small CD's with good CD control, it requires the use of special photolithography equipment which may be very expensive. Dry etching can reduce the CD by exposing a patterned hard mask to prolonged dry etch conditions. Thus, the side walls of the hard mask are eroded by the etching. This method requires an increase in the amount of resist material, since the resist is present during the prolonged dry etch in order to protect the top of the hard mask. Also, the dry etch method has poor control over the reproducibility of the final CD obtained.

BRIEF SUMMARY

In a first aspect, the present invention is a method of making a semiconductor structure, comprising trimming a patterned hard mask with a wet etch, wherein the hard mask is on a gate layer; and etching the gate layer.

In a second aspect, the present invention is a method of making a plurality of structures on a semiconductor wafer, comprising trimming a patterned hard mask layer with a wet etch, wherein the hard mask layer is on a gate layer; and etching the gate layer. An average width of lines in the patterned hard mask layer is trimmed by at least 100 Å.

In a third aspect, the present invention is, in a method of making a semiconductor structure including etching a hard mask layer and etching a gate layer, wherein the hard mask layer is on the gate layer; the improvement comprising trimming the hard mask layer with a wet etch.

DETAILED DESCRIPTION

The present invention includes a method to trim a gate structure to reduce the gate width while maintaining CD control. The method includes performing a hard mask wet etch on a hard mask layer which has already been patterned. The method may be carried out as part of resist stripping and cleaning of the hard mask.

Figure 1:
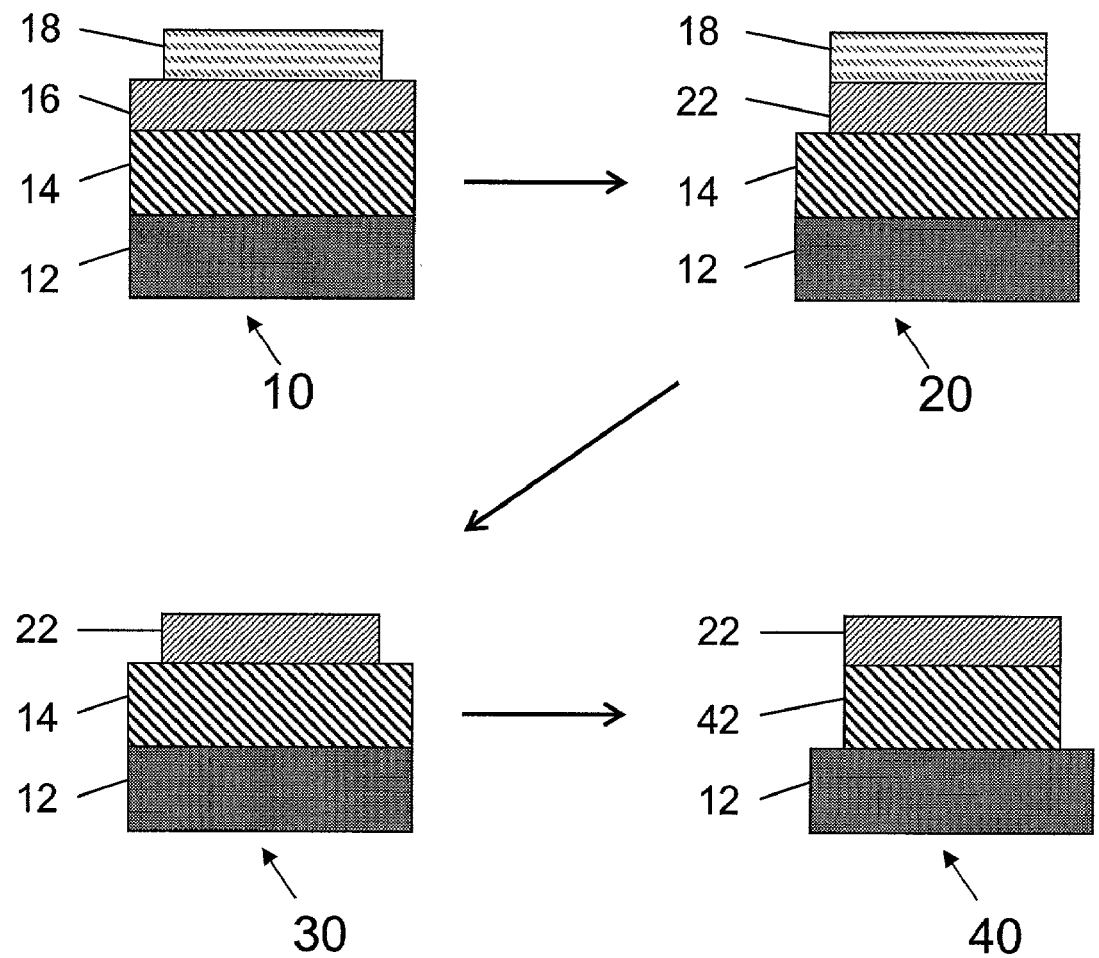
FIG. 1 is a diagram of the conventional steps in forming a stack structure.
Figure 2:
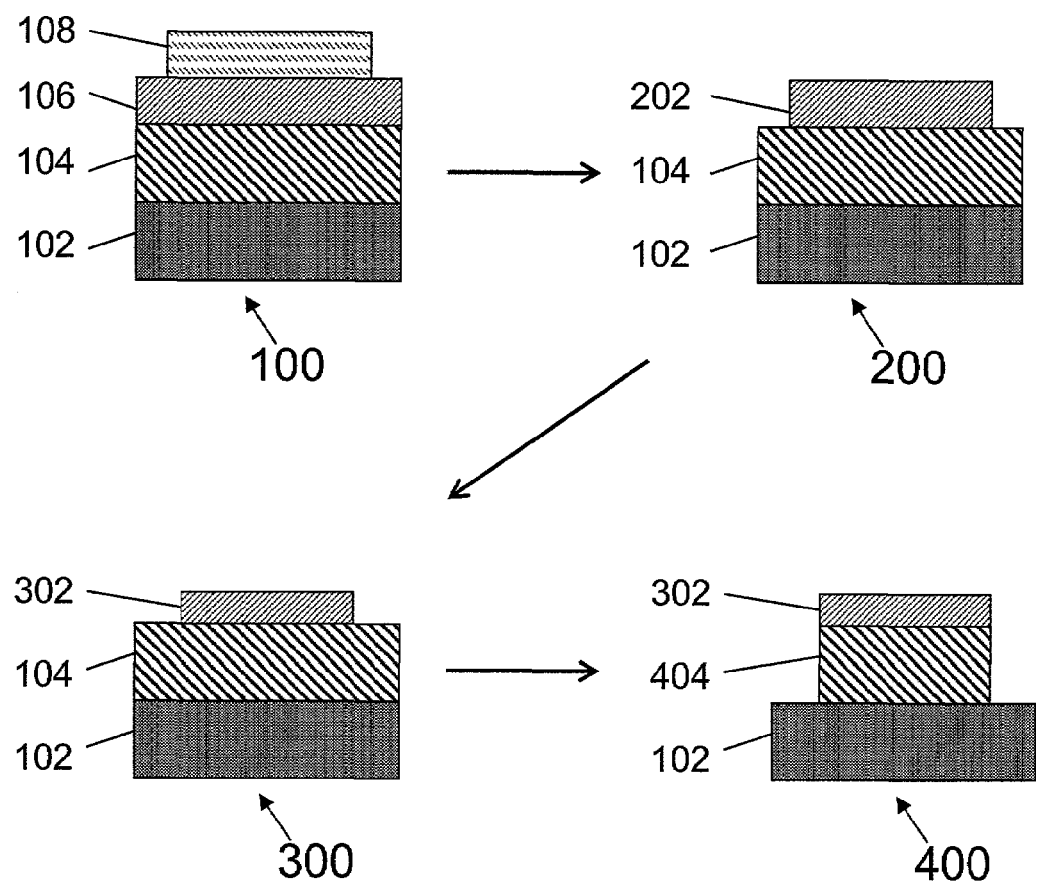
FIG. 2 is a diagram of the steps in a method to form a narrow gate.

An example of a gate formation process including the method is illustrated in FIG. 2. In this example, the resist layer 108 has been patterned to produce structure 100. This structure has a silicon substrate 102 supporting a gate layer 104, which in turn supports a hard mask layer 106 beneath the patterned resist layer. Etching of the hard mask layer 106, followed by stripping of the resist layer, yields structure 200, having a patterned hard mask 202. Next, the patterned hard mask is trimmed by a wet etch prior to the etching of the gate layer 104 to yield structure 300. The width and height of the hard mask layer 202 is reduced by the wet etch process, resulting in a patterned hard mask layer 302 with a reduced width. This patterned hard mask 302 is then used to pattern the gate layer 104, yielding structure 400. The line of patterned gate layer 404 is narrower than the line of a gate layer patterned in a conventional manner.

Suitable hard mask materials include nitrides such as tungsten nitride, silicon nitride, and tantalum nitride; anti-reflective coatings (ARC); oxides such as silicon oxide; suicides such as tungsten silicide; and mixtures of these substances such as silicon oxynitride. The hard mask layer(s) may be deposited on the gate material using standard deposition techniques, including physical vapor deposition (PVD) and chemical vapor deposition (CVD).

The wet etch of the hard mask includes treating the semiconductor structure with a wet etch fluid containing an etching agent. Preferably, the fluid is an aqueous fluid. It is preferred that the wet etching fluid selectively etches the hard mask material(s) and not the gate material(s). For example, if the hard mask is a nitride material and the top layer of the gate stack is an oxide material, the wet etching fluid will preferably be selective to nitride over oxide. The composition of the wet etch fluid preferably provides for desirable etch rates of the specific hard mask. Dilution, concentration, and/or combination of etching agents can provide for adjustment of the etch rate.

Preferably, the wet etch rate is from 1 to 50 Å per minute. More preferably, the wet etch rate is from 5 to 20 Å per minute.

Suitable etching agents include conventional wet etching agents such as hydrofluoric acid (HF), ammonium fluoride ($NH_4F$), phosphoric acid ($H_3PO_4$), sulfuric acid ($H_2SO_4$), and mixtures of these. The fluid used for the wet etch may further contain an abrasive such as metal oxide particles.

Specific examples of etching reagents include aqueous mixtures of HF, $NH_4F$, $NH_4F/H_3PO_4$ mixtures, and $H_3PO_4/H_2SO_4$ mixtures. Preferably, the water in the aqueous mixture is deionized water. Although an oxidizing agent may be present in the wet etch fluid, it is desirable to perform the wet etch with a fluid which does not contain oxidizing agents, such as peroxide. For example, wet etch fluids without oxidizing agents can be used to etch structures containing exposed portions of readily oxidized metals, such as tungsten and tantalum, without degrading the exposed metal.

A preferred wet etch fluid is a dilute solution of HF in deionized water. Preferably, the wet etch fluid contains from 0.01 percent by volume (vol %) HF to 0.3 vol % HF. More preferably, the wet etch fluid contains from 0.03 vol % HF to 0.2 vol % HF. Even more preferably, the wet etch fluid contains about 0.05 vol % HF. Dilute aqueous solutions of HF may be prepared by a variety of methods. For example, a 10:1 solution of water and HF may be combined with deionized water to provide the wet etch fluid. Preferably, wet etching with dilute HF is carried out at elevated temperatures. More preferably, wet etching with dilute HF is carried out at 80° C. to 98° C.

The wet etch may be performed subsequent to the stripping of the resist and the cleaning of the semiconductor structure following the dry etch of the hard mask. Alternatively, the wet etch may be performed at the same time as the cleaning of the hard mask. Combination of the cleaning of the semiconductor structure and the wet etch can advantageously eliminate the need for an additional processing step. The wet etch process may be carried out using standard wet etch techniques, such as the use of a spray tool or an agitated wet sink.

Figure 3:
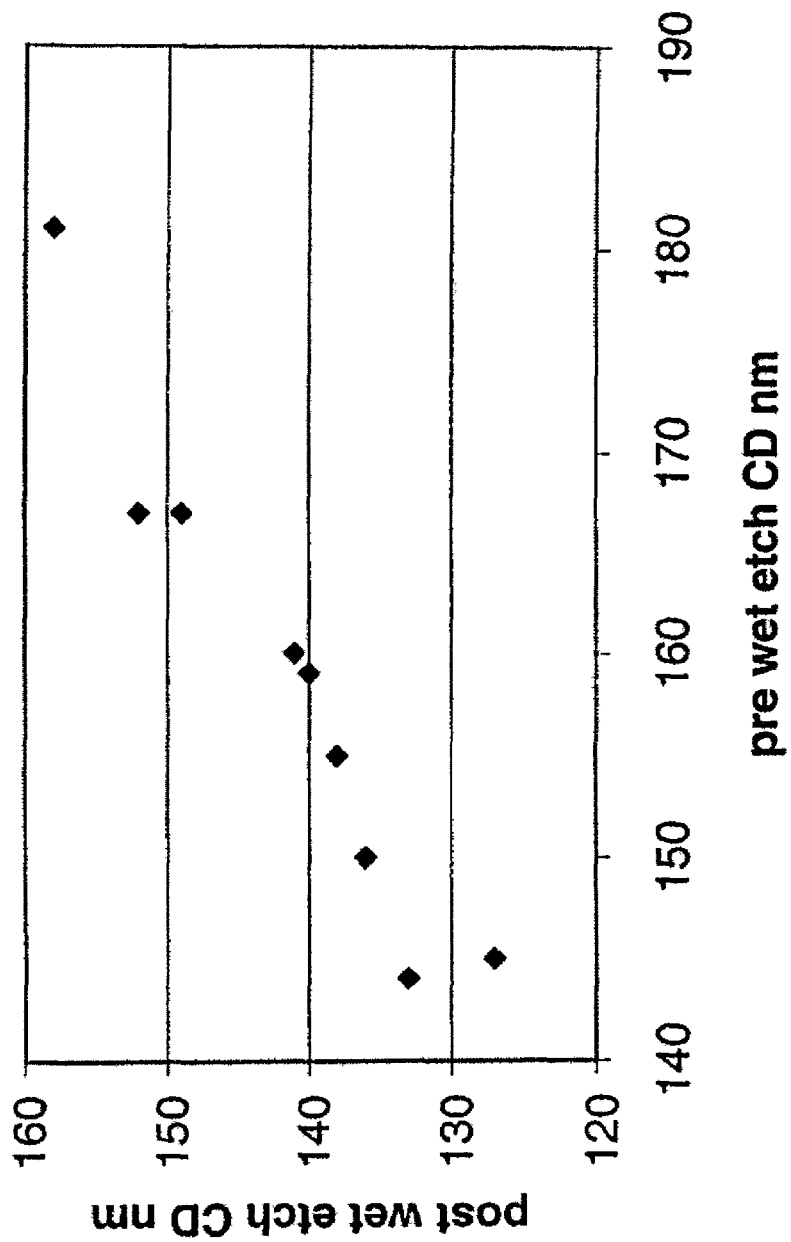
FIG. 3 is a graph comparing the CD after one trimming cycle (horizontal axis) with the CD after two trimming cycles (vertical axis).

The width of a gate can be reduced, for example, from 120 nanometers (nm) to 95 nm by the use of a wet etch to trim the width of the hard mask before etching the gate layer. The reduction in gate width as a result of a wet etch is illustrated in the graph of FIG. 3. The gate width (expressed as CD) after a second wet etch is plotted as a function of the gate width after an initial wet etch. For example, a hard mask structure which has a gate width of 150 nm after an initial wet etch can have a reduced gate width of 130 nm after a second wet etch. The comparison of gate width after the first and second wet etch illustrates the advantageous control of the gate width reduction which is possible with this process. Although multiple wet etches may be performed, it is preferred that only a single wet etch is used to reduce the hard mask width.

Preferably, the gate width may be reduced by at least 100 angstroms (Å). More preferably, the gate width may be reduced by at least 150 Å. Even more preferably, the gate width may be reduced by at least 200 Å. When the gate width is reduced by a given amount, it is preferred that one half of the gate width reduction occurs on each exposed side of the structure. For example, if the gate width is reduced by 200 Å, it is preferred that 100 Å of the width of the structure is removed on each side of the structure. Preferably, the reduction in gate width is consistent within a semiconductor substrate, such as a wafer containing multiple semiconductor structures, and is reproducible from one substrate to another. It is preferred that the overall control of the hard mask etch, including dry etching, resist stripping, cleaning and trimming, results in a standard deviation of the gate width of at most ±10%. More preferably, the standard deviation of the gate width is at most ±5%. It is preferred that the control of the wet etch process results in a standard deviation of the hard mask width of at most ±6%. More preferably, the standard deviation of the hard mask width is at most ±3%.

The patterned hard mask having a reduced width can be used as a mask for etching the gate stack material between the hard mask layer and the silicon substrate. For example, etching of the gate layer following the wet etch of the hard mask layer provides a gate having a width which is substantially uniform from the top of the hard mask to the silicon substrate. Thus, the overall structure formed will have a reduced gate width than would have been provided using conventional etching processes.

Semiconductor structures produced by the present invention may have gate widths which are smaller and more uniform than structures formed without the use of this method and without any photoresolution enhancement. Photoresolution enhancement may provide for gate widths which are smaller and more uniform than those obtained with the present invention, but at much higher cost. Thus, the semiconductor structures on a wafer which has been subjected to the present invention may be distinguished from the semiconductor structures on a wafer which has not been subjected to the present invention, since they will have a standard deviation of gate widths that is between the standard deviation obtainable by a process using photoresolution enhancement and the standard deviation obtainable by a process using prolonged dry etching of the hard mask.

Figure 4:
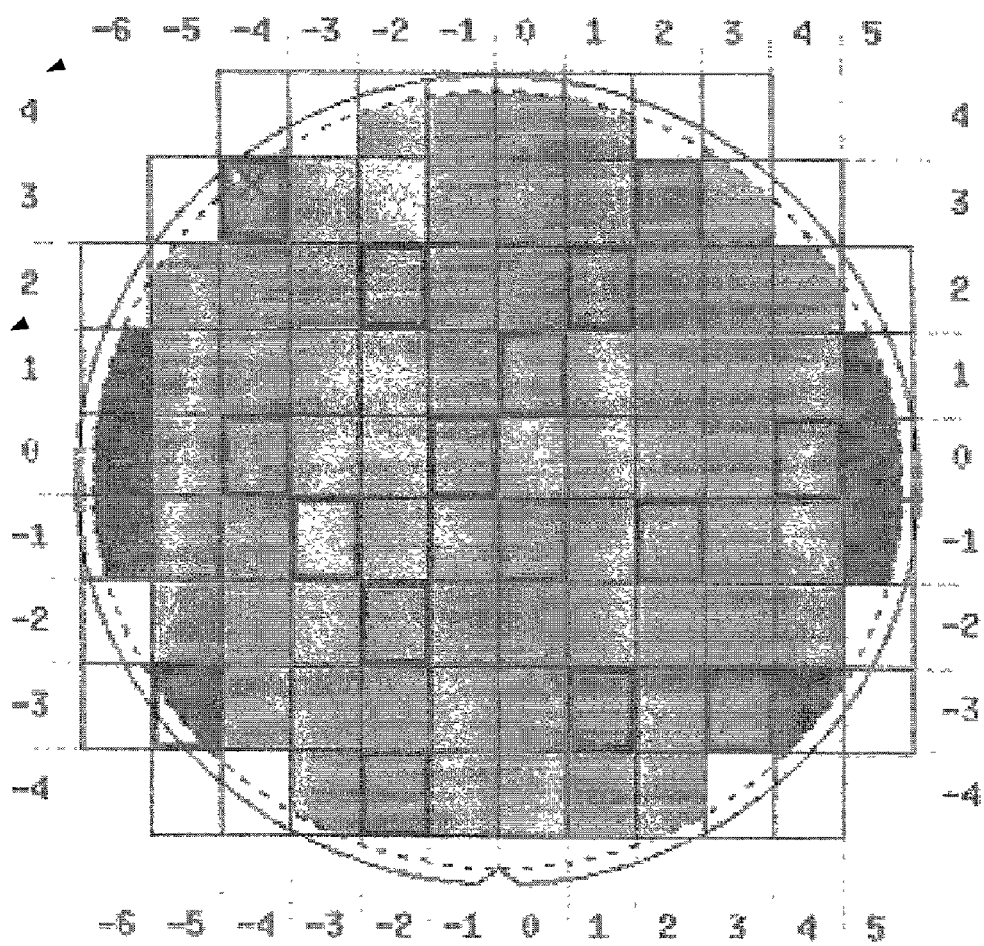
FIG. 4 is a diagram of a semiconductor wafer.

The standard deviation of gate widths on a wafer is determined by measuring the gate widths at sixteen sites on the wafer. The location of these sites is shown diagrammatically in FIG. 4 by the boxes with bold borders. The measurement of an individual gate width within a particular site is combined with the measurements from the other sites to calculate an average, a range, and a standard deviation for the average gate width.

The gate widths on a wafer can be measured using this procedure before the wet etch and after the wet etch. For example, referring to Table A, the measured line widths on a wafer before the wet etch ranged from 160 nm to 175 nm, with a mean of 167 nm and a standard deviation of 3.69 (±2.21%). After the wet etch, the measured line widths ranged from 124 nm to 139 nm, with a mean of 131 nm and a standard deviation of 4.13 (±3.14%). Thus, the percent standard deviation increased only from ±2.21% to ±3.14%.

TABLE A

| Measurement Number | Pre-trim width (nm) | Post-trim width (nm) |
| --- | --- | --- |
| 1 | 173 | 136 |
| 2 | 175 | 134 |
| 3 | 166 | 131 |
| 4 | 168 | 132 |
| 5 | 169 | 132 |
| 6 | 168 | 139 |
| 7 | 167 | 138 |
| 8 | 165 | 127 |
| 9 | 167 | 128 |
| 10 | 166 | 134 |
| 11 | 163 | 131 |
| 12 | 166 | 124 |
| 13 | 168 | 131 |
| 14 | 160 | 128 |
| 15 | 170 | 127 |
| 16 | 163 | 130 |

TABLE A-continued

| Measurement Number | Pre-trim width (nm) | Post-trim width (nm) |
|---|---|---|
| Std. dev. (nm) | 3.69 | 4.13 |
| Mean (nm) | 167 | 131 |
| % Std. dev. | 2.20 | 3.14 |
| Range (nm) | 15 | 15 |

In contrast, a different wafer, having an initial mean line width of 175 nm (±2.07%), was subjected to dry etch conditions to trim the hard mask. In this case, the mean line width after the dry etch trim was 160 nm (±3.78%). Thus, the percent standard deviation had a greater increase for the dry etch trim, from ±2.07% to ±3.78%. Trimming this line from 160 nm to 130 nm by repeating the dry etch exposure would be expected to further increase the percent standard deviation of the line width. Furthemore, this dry etch process required a greater amount of resist than did the wet etch process.

The related processing steps, including the etching of the gate layer and other steps such as polishing, cleaning, and deposition steps, for use in the present invention are well known to those of ordinary skill in the art, and are also described in Encyclopedia of Chemical Technology, Kirk-Othmer, Volume 14, pp. 677–709 (1995); Semiconductor Device Fundamentals, Robert F. Pierret, Addison-Wesley, 1996; Wolf, Silicon Processing for the VLSI Era, Lattice Press, 1986, 1990, 1995 (vols 1–3, respectively), and Microchip Fabrication 4rd. edition, Peter Van Zant, McGraw-Hill, 2000.

The semiconductor structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile.

What is claimed is:

1. A method of making a semiconductor structure, comprising:
   etching a hard mask layer followed by stripping a resist layer on the hard mask layer, to form a patterned hard mask;
   trimming the patterned hard mask with a wet etch, wherein the wet etch comprises at least one member selected from the group consisting of hydrofluoric acid, ammonium fluoride, phosphoric acid, and sulfuric acid, the wet etch is carried out at a temperature of 80° C. to 98° C., and wherein the hard mask is on a gate layer and the hard mask is a material selected from the group consisting of nitrides, anti-reflective coatings, oxides, and silicides; and
   etching the gate layer;
   wherein the patterned hard mask is trimmed at a rate of 1 to 50 Å per minute.

2. The method of claim 1, wherein the wet etch comprises from 0.01 to 0.3 vol % hydrofluoric acid.

3. The method of claim 1, wherein the wet etch comprises from 0.03 to 0.2 vol % hydrofluoric acid.

4. The method of claim 1, wherein the patterned hard mask is trimmed at a rate of 5 to 20 Å per minute.

5. The method of claim 1, wherein a width of the patterned hard mask is reduced by at least 100 Å.

6. The method of claim 1, wherein a width of the patterned hard mask is reduced by at least 150 Å.

7. The method of claim 1, wherein:
   the patterned hard mask is trimmed at a rate of 1 to 50 Å per minute; and
   a width of the patterned hard mask is reduced by at least 100 Å.

8. A method of making a plurality of structures on a semiconductor wafer, comprising making each semiconductor structure by the method of claim 1.

9. The method of claim 8, wherein the standard deviation of the width of lines in the patterned hard mask layer is less than ±6%.

10. The method of claim 8, wherein the standard deviation of the width lines in the patterned hard mask layer is less than ±3%.

11. A method of making a semiconductor device, comprising:
   making a semiconductor structure by the method of claim 1; and
   forming a semiconductor device from said structure.

12. A method of making an electronic device, comprising:
   making a semiconductor device by the method of claim 11; and
   forming an electronic device, comprising said semiconductor device.

13. A method of making a semiconductor device, comprising:
   making a semiconductor structure by the method of claim 7; and
   forming a semiconductor device from said structure.

14. A method of making an electronic device, comprising:
   making a semiconductor device by the method of claim 13; and
   forming an electronic device, comprising said semiconductor device.

15. A semiconductor structure, formed by the method of claim 1.

16. A method of making a semiconductor structure, comprising:
   etching a hard mask layer followed by stripping a resist layer on the hard mask layer, to form a patterned hard mask;
   trimming the patterned hard mask with a wet etch, wherein the wet etch comprises at least one member selected from the group consisting of ammonium fluoride, phosphoric acid, and sulfuric acid, and wherein the hard mask is on a gate layer and the hard mask is a material selected from the group consisting of nitrides, anti-reflective coatings, oxides, and silicides; and
   etching the gate layer.

17. A method of making a semiconductor structure, comprising:
   etching a hard mask layer followed by stripping a resist layer on the hard mask layer, to form a patterned hard mask;
   trimming the patterned hard mask with a wet etch, wherein the wet etch comprises at least one member selected from the group consisting of hydrofluoric acid, ammonium fluoride, phosphoric acid, and sulfuric acid, and wherein the hard mask is on a gate layer and the hard mask is a material selected from the group consisting of nitrides, anti-reflective coatings, and silicides; and
   etching the gate layer.

18. The method of claim 17, wherein the hard mask is silicon oxynitride.

* * * * *